(12) United States Patent
Geshi et al.

(10) Patent No.: US 11,545,356 B2
(45) Date of Patent: Jan. 3, 2023

(54) POLYCRYSTALLINE CERAMIC SUBSTRATE, BONDING-LAYER-INCLUDING POLYCRYSTALLINE CERAMIC SUBSTRATE, AND LAMINATED SUBSTRATE

(71) Applicant: SUMITOMO ELECTRIC INDUSTRIES, LTD., Osaka (JP)

(72) Inventors: Keiichiro Geshi, Osaka (JP); Shigeru Nakayama, Osaka (JP); Masashi Yoshimura, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 1127 days.

(21) Appl. No.: 16/091,241

(22) PCT Filed: Apr. 5, 2017

(86) PCT No.: PCT/JP2017/014255
§ 371 (c)(1),
(2) Date: Oct. 4, 2018

(87) PCT Pub. No.: WO2017/175801
PCT Pub. Date: Oct. 12, 2017

(65) Prior Publication Data
US 2019/0131123 A1 May 2, 2019

(30) Foreign Application Priority Data
Apr. 7, 2016 (JP) .............................. JP2016-077130

(51) Int. Cl.
B32B 15/04 (2006.01)
H01L 21/02 (2006.01)
(Continued)

(52) U.S. Cl.
CPC .......... *H01L 21/0242* (2013.01); *B32B 18/00* (2013.01); *C04B 35/117* (2013.01);
(Continued)

(58) Field of Classification Search
None
See application file for complete search history.

(56) References Cited

U.S. PATENT DOCUMENTS

2012/0146023 A1* 6/2012 Craft ...................... C04B 37/003
257/51
2013/0040442 A1* 2/2013 Satoh ................ H01L 21/76256
257/E21.09
(Continued)

FOREIGN PATENT DOCUMENTS

JP H03-34531 A 2/1991
JP 2006-121091 A 5/2006
(Continued)

*Primary Examiner* — Seth Dumbris
(74) *Attorney, Agent, or Firm* — Faegre Drinker Biddle & Reath LLP

(57) ABSTRACT

Provided is a polycrystalline ceramic substrate to be bonded to a compound semiconductor substrate with a bonding layer interposed therebetween, wherein at least one of relational expression (1) $0.7<\alpha_1/\alpha_2<0.9$ and relational expression (2) $0.7<\alpha_3/\alpha_4<0.9$ holds, where $\alpha_1$ represents a linear expansion coefficient of the polycrystalline ceramic substrate at 30° C. to 300° C. and $\alpha_2$ represents a linear expansion coefficient of the compound semiconductor substrate at 30° C. to 300° C., and $\alpha_3$ represents a linear expansion coefficient of the polycrystalline ceramic substrate at 30° C. to 1000° C. and $\alpha_4$ represents a linear expansion coefficient of the compound semiconductor substrate at 30° C. to 1000° C.

5 Claims, 3 Drawing Sheets

(51) Int. Cl.
 *C30B 33/06*  (2006.01)
 *C04B 37/00*  (2006.01)
 *C30B 29/40*  (2006.01)
 *H01L 21/762*  (2006.01)
 *C04B 35/117*  (2006.01)
 *C04B 35/185*  (2006.01)
 *B32B 18/00*  (2006.01)
 *C04B 37/02*  (2006.01)

(52) U.S. Cl.
 CPC ............ *C04B 35/185* (2013.01); *C04B 37/00* (2013.01); *C04B 37/003* (2013.01); *C04B 37/005* (2013.01); *C04B 37/023* (2013.01); *C30B 29/40* (2013.01); *C30B 33/06* (2013.01); *H01L 21/02458* (2013.01); *H01L 21/02461* (2013.01); *H01L 21/02463* (2013.01); *H01L 21/02488* (2013.01); *H01L 21/7624* (2013.01); *B32B 2457/00* (2013.01); *C04B 2235/3217* (2013.01); *C04B 2235/3463* (2013.01); *C04B 2235/80* (2013.01); *C04B 2235/96* (2013.01); *C04B 2235/963* (2013.01); *C04B 2235/9607* (2013.01); *C04B 2237/062* (2013.01); *C04B 2237/34* (2013.01); *C04B 2237/341* (2013.01); *C04B 2237/343* (2013.01); *C04B 2237/346* (2013.01); *C04B 2237/36* (2013.01); *C04B 2237/365* (2013.01); *C04B 2237/366* (2013.01); *C04B 2237/368* (2013.01); *C04B 2237/40* (2013.01); *C04B 2237/52* (2013.01); *C04B 2237/592* (2013.01)

(56) References Cited

U.S. PATENT DOCUMENTS

| | | | |
|---|---|---|---|
| 2013/0157445 A1* | 6/2013 | Miyashita | H01L 21/02389 501/98.4 |
| 2015/0048301 A1* | 2/2015 | Kilbury | H01L 33/02 257/618 |
| 2016/0380045 A1* | 12/2016 | Machuca | H01L 29/7788 257/52 |

FOREIGN PATENT DOCUMENTS

| | | | |
|---|---|---|---|
| JP | 2009-260391 A | | 11/2009 |
| JP | 2010-182936 A | | 8/2010 |
| JP | 2012-124473 A | | 6/2012 |
| JP | 2013-116848 A | | 6/2013 |
| JP | 2013116826 A | * | 6/2013 |
| JP | 2014-36195 A | | 2/2014 |
| JP | 2014-131005 A | | 7/2014 |

\* cited by examiner

US 11,545,356 B2

POLYCRYSTALLINE CERAMIC SUBSTRATE, BONDING-LAYER-INCLUDING POLYCRYSTALLINE CERAMIC SUBSTRATE, AND LAMINATED SUBSTRATE

TECHNICAL FIELD

The present invention relates to a polycrystalline ceramic substrate, a bonding-layer-including polycrystalline ceramic substrate, and a laminated substrate.

The present application claims the benefit of priority based on Japanese Patent Application No. 2016-077130 filed on Apr. 7, 2016, the entire contents of which are incorporated herein by reference.

BACKGROUND ART

Compound semiconductors have been employed as materials for semiconductor devices such as diodes (including light emitting diodes), transistors, lasers, and light-receiving devices. Semiconductor devices formed of compound semiconductors are produced by forming an epitaxial layer of a compound semiconductor on a substrate and forming, for example, an electrode on the epitaxial layer.

The epitaxial layer of a compound semiconductor can be formed by providing a substrate formed of the same compound semiconductor as that of the epitaxial layer and performing epitaxial growth on the substrate. This can provide a high-quality epitaxial layer of the compound semiconductor. However, such a substrate formed of a compound semiconductor is expensive. Therefore, the formation of an epitaxial layer by this method increases the production cost of semiconductor devices.

The epitaxial layer of a compound semiconductor can also be formed by performing epitaxial growth on a relatively inexpensive substrate that is formed of a material different from that of the epitaxial layer. However, the quality of the epitaxial layer formed by this method deteriorates because of, for example, a difference in lattice constant between the epitaxial layer and the substrate and a difference in linear expansion coefficient between the epitaxial layer and the substrate.

On the other hand, there has been proposed a laminated substrate produced by providing a thin compound semiconductor substrate formed of the same compound semiconductor as that of an epitaxial layer and bonding the compound semiconductor substrate to a base substrate (e.g., refer to PTL 1).

CITATION LIST

Patent Literature

PTL 1: Japanese Unexamined Patent Application Publication No. 2009-260391

SUMMARY OF INVENTION

A polycrystalline ceramic substrate according to the present invention is a polycrystalline ceramic substrate to be bonded to a compound semiconductor substrate with a bonding layer interposed therebetween. In this polycrystalline ceramic substrate, at least one of relational expression (1) and relational expression (2) holds:

$$0.7 < \alpha_1/\alpha_2 < 0.9 \tag{1}$$

$$0.7 < \alpha_3/\alpha_4 < 0.9 \tag{2}$$

where $\alpha_1$ represents a linear expansion coefficient of the polycrystalline ceramic substrate at 30° C. to 300° C., $\alpha_2$ represents a linear expansion coefficient of the compound semiconductor substrate at 30° C. to 300° C., $\alpha_3$ represents a linear expansion coefficient of the polycrystalline ceramic substrate at 30° C. to 1000° C., and $\alpha_4$ represents a linear expansion coefficient of the compound semiconductor substrate at 30° C. to 1000° C.

DESCRIPTION OF EMBODIMENTS

Figure 1:
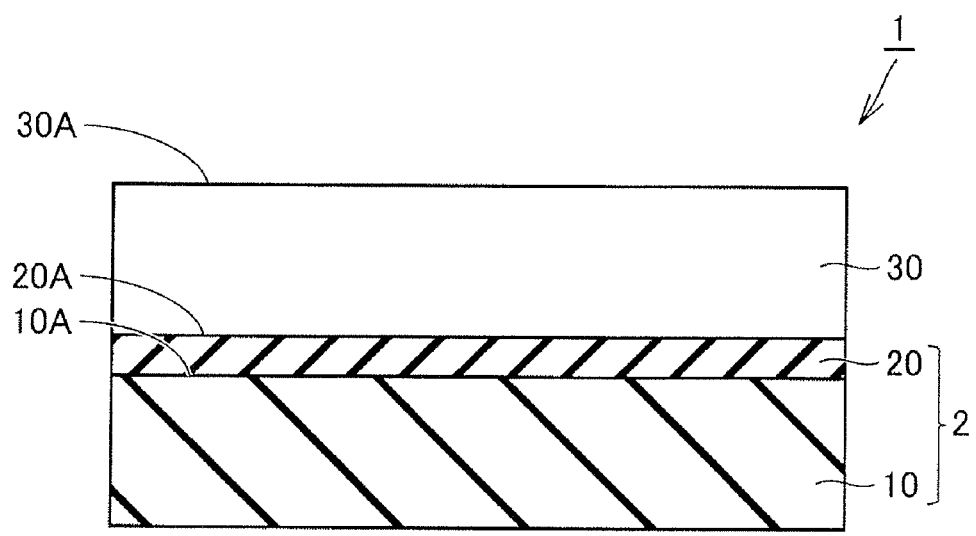
FIG. 1 is a schematic sectional view illustrating a structure of a laminated substrate.

Problems to be Solved by the Present Disclosure

The bonding state of known laminated substrates deteriorates when an epitaxial layer is formed. This decreases the production efficiency of semiconductor devices. Accordingly, it is an object of the present disclosure to provide a polycrystalline ceramic substrate suitable as a base substrate for a laminated substrate capable of suppressing a decrease in the production efficiency of semiconductor devices due to deterioration of a bonding state, and a bonding-layer-including polycrystalline ceramic substrate and a laminated substrate that each include the polycrystalline ceramic substrate.

Advantageous Effects of the Present Disclosure

According to the polycrystalline ceramic substrate of the present invention, there can be provided a polycrystalline ceramic substrate suitable as a base substrate for a laminated substrate capable of suppressing a decrease in the production efficiency of semiconductor devices due to deterioration of a bonding state.

DESCRIPTION OF EMBODIMENTS OF THE PRESENT INVENTION

First, embodiments of the present invention will be listed and described. The polycrystalline ceramic substrate according to the present application is a polycrystalline ceramic substrate to be bonded to a compound semiconductor substrate with a bonding layer interposed therebetween. In this polycrystalline ceramic substrate, at least one of relational expression (1) and relational expression (2) holds:

$$0.7 < \alpha_1/\alpha_2 < 0.9 \tag{1}$$

$$0.7 < \alpha_3/\alpha_4 < 0.9 \tag{2}$$

where $\alpha_1$ represents a linear expansion coefficient of the polycrystalline ceramic substrate at 30° C. to 300° C., $\alpha_2$ represents a linear expansion coefficient of the compound semiconductor substrate at 30° C. to 300° C., $\alpha_3$ represents a linear expansion coefficient of the polycrystalline ceramic substrate at 30° C. to 1000° C., and $\alpha_4$ represents a linear expansion coefficient of the compound semiconductor substrate at 30° C. to 1000° C.

To suppress a decrease in the production efficiency of semiconductor devices due to deterioration of the bonding state of a laminated substrate during formation of an epitaxial layer, it is conceivable that the difference in linear expansion coefficient between the polycrystalline ceramic substrate employed as a base substrate and the compound semiconductor substrate is simply reduced. In reality, however, it has been found that when the compound semiconductor substrate is bonded to the polycrystalline ceramic substrate with a bonding layer interposed therebetween, the decrease in the production efficiency of semiconductor devices due to deterioration of the bonding state of a laminated substrate during formation of an epitaxial layer can be suppressed by setting the linear expansion coefficient of the polycrystalline ceramic substrate (base substrate) to a linear expansion coefficient slightly smaller than that of the compound semiconductor substrate. Specifically, when the ratio of the linear expansion coefficient of the polycrystalline ceramic substrate (base substrate) to the linear expansion coefficient of the compound semiconductor substrate is set to more than 0.7 and less than 0.9, the decrease in the production efficiency of semiconductor devices due to deterioration of the bonding state of a laminated substrate during formation of an epitaxial layer can be suppressed.

In the polycrystalline ceramic substrate according to the present application, the ratio of the linear expansion coefficient of the polycrystalline ceramic substrate to the linear expansion coefficient of the compound semiconductor substrate in a temperature range of 30° C. to 300° C. or a temperature range of 30° C. to 1000° C. that corresponds to a temperature range in which an epitaxial layer is formed is set to more than 0.7 and less than 0.9. Therefore, the polycrystalline ceramic substrate according to the present application can provide a polycrystalline ceramic substrate suitable as a base substrate for a laminated substrate capable of suppressing a decrease in the production efficiency of semiconductor devices due to deterioration of a bonding state.

The polycrystalline ceramic substrate may have a Young's modulus of 200 GPa or more. This readily suppresses the deterioration of the bonding state of a laminated substrate.

In the polycrystalline ceramic substrate, the bonding layer may be formed of an oxide containing silicon. The polycrystalline ceramic substrate is suitable as a base substrate in the case where an oxide containing silicon is employed as a material for the bonding layer.

The polycrystalline ceramic substrate may be formed of at least one material selected from the group consisting of spinel ($MgAl_2O_4$), alumina ($Al_2O_3$), magnesia (MgO), silica ($SiO_2$), mullite ($3Al_2O_3.2SiO_2$), cordierite ($2MgO.2Al_2O_3.5SiO_2$), calcia (CaO), titania ($TiO_2$), silicon nitride ($Si_3N_4$), aluminum nitride (AlN), and silicon carbide (SiC). These materials are suitable as a material for the polycrystalline ceramic substrate according to the present application.

In the polycrystalline ceramic substrate, the compound semiconductor substrate may be formed of any one of compound semiconductors selected from the group consisting of gallium arsenide, gallium nitride, and indium phosphide. The polycrystalline ceramic substrate is suitable as a base substrate in the case where any one of compound semiconductors selected from the group consisting of gallium arsenide, gallium nitride, and indium phosphide is employed as a material for the compound semiconductor substrate.

In the polycrystalline ceramic substrate, the compound semiconductor substrate may be formed of gallium arsenide and the relational expression (1) may hold. When the ratio of the linear expansion coefficient of the polycrystalline ceramic substrate to the linear expansion coefficient of the compound semiconductor substrate formed of gallium arsenide in a temperature range of 30° C. to 300° C. that corresponds to a temperature range in which an epitaxial layer formed of gallium arsenide is formed is set to more than 0.7 and less than 0.9, the decrease in the production efficiency of semiconductor devices due to deterioration of the bonding state of a laminated substrate during formation of the epitaxial layer can be suppressed with more certainty.

In the polycrystalline ceramic substrate, the compound semiconductor substrate may be formed of gallium nitride and the relational expression (2) may hold. When the ratio of the linear expansion coefficient of the polycrystalline ceramic substrate to the linear expansion coefficient of the compound semiconductor substrate formed of gallium nitride in a temperature of 30° C. to 1000° C. that corresponds to a temperature range in which an epitaxial layer formed of gallium nitride is formed is set to more than 0.7 and less than 0.9, the decrease in the production efficiency of semiconductor devices due to deterioration of the bonding state of a laminated substrate during formation of the epitaxial layer can be suppressed with more certainty.

In the polycrystalline ceramic substrate, the compound semiconductor substrate may be formed of indium phosphide and the relational expression (2) may hold. When the ratio of the linear expansion coefficient of the polycrystalline ceramic substrate to the linear expansion coefficient of the compound semiconductor substrate formed of indium phosphide in a temperature range of 30° C. to 1000° C. that corresponds to a temperature range in which an epitaxial layer formed of indium phosphide is formed is set to more than 0.7 and less than 0.9, the decrease in the production efficiency of semiconductor devices due to deterioration of the bonding state of a laminated substrate during formation of the epitaxial layer can be suppressed with more certainty.

A bonding-layer-including polycrystalline ceramic substrate according to the present application includes the above polycrystalline ceramic substrate and a bonding layer formed on a main surface of the polycrystalline ceramic substrate. The bonding-layer-including polycrystalline ceramic substrate according to the present application that includes the above polycrystalline ceramic substrate can provide a laminated substrate capable of suppressing the decrease in the production efficiency of semiconductor devices due to deterioration of the bonding state of a laminated substrate during formation of an epitaxial layer by being bonded to the compound semiconductor substrate with the bonding layer interposed therebetween.

A laminated substrate according to the present application includes the above polycrystalline ceramic substrate, a bonding layer formed on a main surface of the polycrystalline ceramic substrate, and a compound semiconductor substrate disposed on the bonding layer. The polycrystalline ceramic substrate and the compound semiconductor substrate are bonded to each other via the bonding layer. The laminated substrate according to the present application in which the polycrystalline ceramic substrate and the compound semiconductor substrate are bonded to each other via the bonding layer can suppress the decrease in the production efficiency of semiconductor devices due to deterioration of the bonding state of a laminated substrate during formation of an epitaxial layer.

Details of Embodiments of the Present Invention

Next, embodiments of the polycrystalline ceramic substrate, the bonding-layer-including polycrystalline ceramic substrate, and the laminated substrate according to the present invention will be described below with reference to the attached drawings. In the drawings, the same or corresponding parts are designated by the same reference numerals, and the description thereof is omitted.

As illustrated in FIG. 1, the laminated substrate 1 according to this embodiment includes a polycrystalline ceramic substrate 10, a bonding layer 20 formed on one main surface 10A of the polycrystalline ceramic substrate 10, and a compound semiconductor substrate 30 disposed on the bonding layer 20. The polycrystalline ceramic substrate 10 and the compound semiconductor substrate 30 are bonded to each other via the bonding layer 20. The polycrystalline ceramic substrate 10 and the bonding layer 20 constitute a bonding-layer-including polycrystalline ceramic substrate 2 according to this embodiment.

The polycrystalline ceramic substrate 10 is, for example, a polycrystal formed of at least one material selected from the group consisting of spinel, alumina, magnesia, silica, mullite, cordierite, calcia, titania, silicon nitride, aluminum nitride, and silicon carbide. In this embodiment, the polycrystalline ceramic substrate 10 is a sintered body.

The compound semiconductor substrate 30 is formed of, for example, any one of compound semiconductors selected from the group consisting of gallium arsenide (GaAs), gallium nitride (GaN), and indium phosphide (InP). The compound semiconductor substrate 30 is a single crystal formed of a compound semiconductor. In the production process of semiconductor devices, an epitaxial layer formed of a compound semiconductor is formed on a main surface 30A of the compound semiconductor substrate 30 opposite to the bonding layer 20.

The bonding layer 20 is formed of, for example, an oxide containing silicon. More specifically, the bonding layer 20 is formed of, for example, silicon dioxide ($SiO_2$). The thickness of the bonding layer 20 is smaller than that of the polycrystalline ceramic substrate 10 and that of the compound semiconductor substrate 30.

At least one of relational expression (1) and relational expression (2) holds:

$$0.7 < \alpha_1/\alpha_2 < 0.9 \quad (1)$$

$$0.7 < \alpha_3/\alpha_4 < 0.9 \quad (2)$$

where $\alpha_1$ represents a linear expansion coefficient of the polycrystalline ceramic substrate 10 at 30° C. to 300° C., $\alpha_2$ represents a linear expansion coefficient of the compound semiconductor substrate 30 at 30° C. to 300° C., $\alpha_3$ represents a linear expansion coefficient of the polycrystalline ceramic substrate 10 at 30° C. to 1000° C., and $\alpha_4$ represents a linear expansion coefficient of the compound semiconductor substrate 30 at 30° C. to 1000° C.

More specifically, when the compound semiconductor substrate 30 is formed of gallium arsenide, the relational expression (1) preferably holds. When the ratio of the linear expansion coefficient of the polycrystalline ceramic substrate 10 to the linear expansion coefficient of the compound semiconductor substrate 30 formed of gallium arsenide in a temperature range of 30° C. to 300° C. that corresponds to a temperature range in which an epitaxial layer formed of gallium arsenide is formed is set to more than 0.7 and less than 0.9, the decrease in the production efficiency of semiconductor devices due to deterioration of the bonding state of the laminated substrate 1 during formation of the epitaxial layer can be suppressed with more certainty.

When the compound semiconductor substrate 30 is formed of gallium nitride, the relational expression (2) preferably holds. When the ratio of the linear expansion coefficient of the polycrystalline ceramic substrate 10 to the linear expansion coefficient of the compound semiconductor substrate 30 formed of gallium nitride in a temperature range of 30° C. to 1000° C. that corresponds to a temperature range in which an epitaxial layer formed of gallium nitride is formed is set to more than 0.7 and less than 0.9, the decrease in the production efficiency of semiconductor devices due to deterioration of the bonding state of the laminated substrate 1 during formation of the epitaxial layer can be suppressed with more certainty.

When the compound semiconductor substrate 30 is formed of indium phosphide, the relational expression (2) preferably holds. When the ratio of the linear expansion coefficient of the polycrystalline ceramic substrate 10 to the linear expansion coefficient of the compound semiconductor substrate 30 formed of indium phosphide in a temperature range of 30° C. to 1000° C. that corresponds to a temperature range in which an epitaxial layer formed of indium phosphide is formed is set to more than 0.7 and less than 0.9, the decrease in the production efficiency of semiconductor devices due to deterioration of the bonding state of the laminated substrate 1 during formation of the epitaxial layer can be suppressed with more certainty.

In the polycrystalline ceramic substrate 10, the bonding-layer-including polycrystalline ceramic substrate 2, and the laminated substrate 1 according to this embodiment, the ratio of the linear expansion coefficient of the polycrystalline ceramic substrate 10 to the linear expansion coefficient of the compound semiconductor substrate 30 in a temperature range of 30° C. to 300° C. or a temperature range of 30° C. to 1000° C. that corresponds to a temperature range in which an epitaxial layer is formed is set to more than 0.7 and less than 0.9. Therefore, the polycrystalline ceramic substrate 10, the bonding-layer-including polycrystalline ceramic substrate 2, and the laminated substrate 1 according to this embodiment can suppress the decrease in the production efficiency of semiconductor devices due to deterioration of the bonding state of the laminated substrate 1.

From the viewpoint of further suppressing the decrease in the production efficiency of semiconductor devices due to deterioration of the bonding state of the laminated substrate 1, the ratio of the linear expansion coefficients is preferably more than 0.75 and less than 0.85. The linear expansion coefficient can be measured in conformity with JIS R1618.

The polycrystalline ceramic substrate 10 preferably has a Young's modulus of 200 GPa or more. This readily suppresses the deterioration of the bonding state of the laminated substrate 1. The Young's modulus can be measured in conformity with JIS R1602. To more readily suppress the deterioration of the bonding state of the laminated substrate 1, the polycrystalline ceramic substrate 10 more preferably has a Young's modulus of 250 GPa or more.

Figure 2:
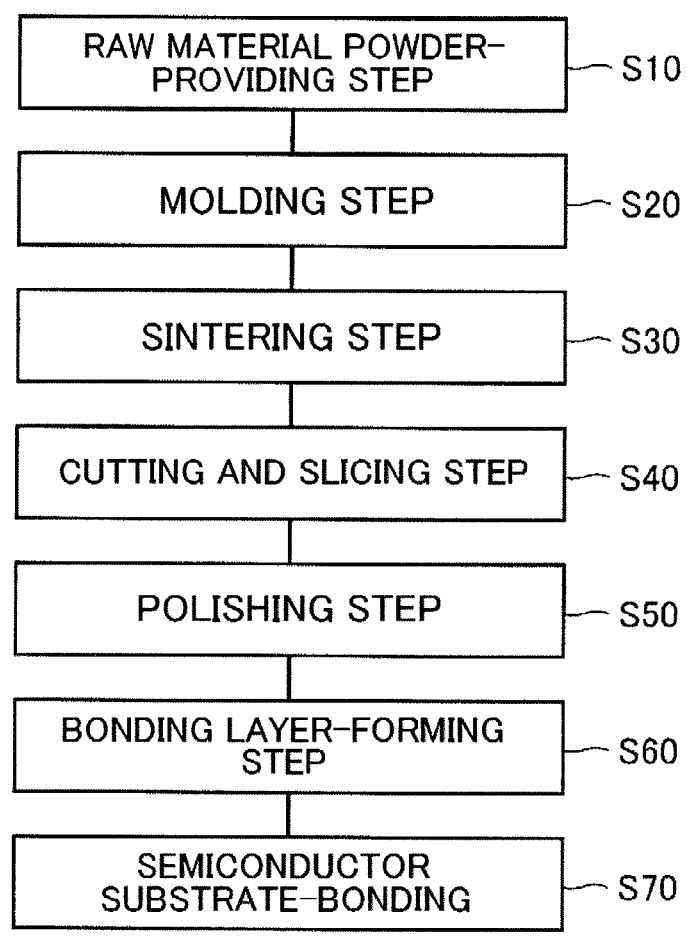
FIG. 2 is a flow chart schematically illustrating a method for producing a polycrystalline ceramic substrate, and a bonding-layer-including polycrystalline ceramic substrate and a laminated substrate that each include the polycrystalline ceramic substrate.

Next, a method for producing a polycrystalline ceramic substrate 10, a bonding-layer-including polycrystalline ceramic substrate 2, and a laminated substrate 1 according to this embodiment will be described. As illustrated in FIG. 2, in the method for producing a polycrystalline ceramic substrate 10, a bonding-layer-including polycrystalline ceramic substrate 2, and a laminated substrate 1 according to this embodiment, first, a raw material powder-providing step (S10) is performed. In this step (S10), a ceramic powder for the polycrystalline ceramic substrate 10 is provided. Specifically, for example, a plurality of ceramic powders selected from the group consisting of spinel, alumina, magnesia, silica, mullite, cordierite, calcia, titania, silicon nitride, aluminum nitride, and silicon carbide are mixed with each other at such an appropriate ratio that a desired linear expansion coefficient can be achieved in consideration of the relationship with the linear expansion coefficient of the compound semiconductor substrate 30 to be bonded. Thus, a raw material powder can be provided.

Subsequently, a molding step (S20) is performed. In this step (S20), the raw material powder provided in the step (S10) is molded to produce a molded body. Specifically, the molded body can be produced by, for example, performing preforming by press molding and then performing CIP (cold isostatic pressing).

Subsequently, a sintering step (S30) is performed. In this step (S30), the molded body produced in the step (S20) is subjected to sintering treatment to produce a sintered body. The sintering treatment can be performed by a method such as vacuum sintering or HIP (hot isostatic pressing). Thus, a sintered body is obtained.

Figure 3:
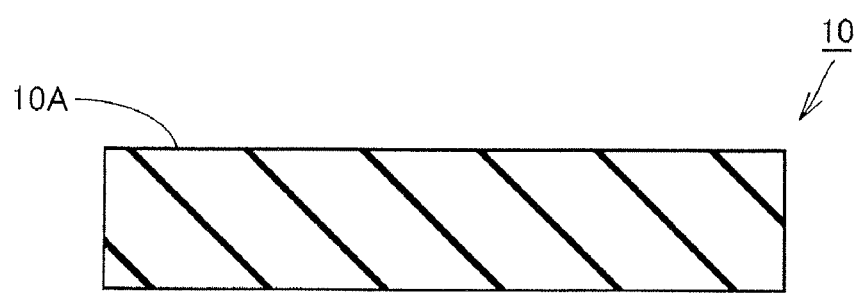
FIG. 3 is a schematic sectional view of a polycrystalline ceramic substrate.

Subsequently, a cutting and slicing step (S40) is performed. In this step (S40), the sintered body produced in the step (S30) is cut and sliced to control the shape and thickness of the sintered body. Specifically, for example, the sintered body produced in the step (S30) is cut and sliced so as to have a diameter of 4 inches and a thickness appropriate for base substrates. Thus, a polycrystalline ceramic substrate 10 is obtained as illustrated in FIG. 3.

Subsequently, a polishing step (S50) is performed. In this step (S50), as illustrated in FIG. 3, one main surface 10A of the polycrystalline ceramic substrate 10 produced in the step (S40) is polished so as to have an appropriate roughness. The polishing can be performed, for example, in three steps of rough polishing, normal polishing, and finishing polishing.

The rough polishing can be performed on the main surface 10A using, for example, a GC (green silicon carbide) wheel with #800 to #2000 abrasive grains. After completion of the rough polishing, the normal polishing is performed on the main surface 10A. Specifically, the normal polishing can be performed using, for example, a diamond wheel with abrasive grains having a grain size of 3 to 5 μm. After completion of the normal polishing, the finishing polishing is performed on the main surface 10A. Specifically, the finishing polishing can be performed using, for example, diamond abrasive grains having a grain size of 0.5 to 1.0 μm. Thus, the main surface 10A has, for example, a roughness Ra of 0.1 nm or more and 3.0 nm or less. Through the above procedure, the polycrystalline ceramic substrate 10 according to this embodiment is completed.

Figure 4:
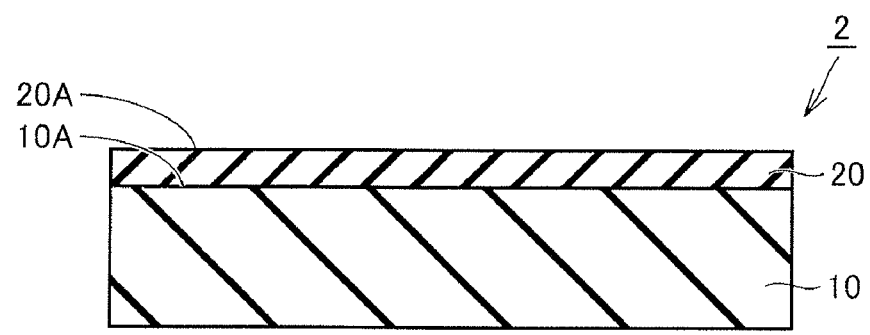
FIG. 4 is a schematic sectional view of a bonding-layer-including polycrystalline ceramic substrate.

Subsequently, a bonding layer-forming step (S60) is performed. In this step (S60), as illustrated in FIG. 3 and FIG. 4, a bonding layer 20 formed of, for example, silicon dioxide is formed on the one main surface 10A of the polycrystalline ceramic substrate 10 according to this embodiment that is produced through the steps (S10) to (S50). The bonding layer 20 can be formed by, for example, performing CVD (chemical vapor deposition). Through the above procedure, as illustrated in FIG. 4, a bonding-layer-including polycrystalline ceramic substrate 2 according to this embodiment is completed.

Subsequently, a semiconductor substrate-bonding step (S70) is performed. In this step (S70), a compound semiconductor substrate 30 is bonded to the bonding-layer-including polycrystalline ceramic substrate 2 produced through the steps (S10) to (S60). Specifically, as illustrated in FIG. 4 and FIG. 1, a separately provided compound semiconductor substrate 30 that is formed of a compound semiconductor such as gallium arsenide or gallium nitride and has a diameter of 4 inches is placed on a main surface 20A of the bonding layer 20 opposite to the polycrystalline ceramic substrate 10. The bonding-layer-including polycrystalline ceramic substrate 2 and the compound semiconductor substrate 30 are heated while being pressed against the bonding layer 20. Thus, the compound semiconductor substrate 30 is bonded to the polycrystalline ceramic substrate 10 with the bonding layer 20 interposed therebetween. Through the above procedure, as illustrated in FIG. 1, a laminated substrate 1 according to this embodiment is completed. Then, a semiconductor device is produced through a procedure including a step of forming an epitaxial layer formed of a compound semiconductor on a main surface 30A of the compound semiconductor substrate 30 opposite to the bonding layer 20.

In the laminated substrate 1, the ratio of the linear expansion coefficient of the polycrystalline ceramic substrate 10 to the linear expansion coefficient of the compound semiconductor substrate 30 in a temperature range of 30° C. to 300° C. or a temperature range of 30° C. to 1000° C. that corresponds to a temperature range in which an epitaxial layer is formed is set to more than 0.7 and less than 0.9. This suppresses the decrease in the production efficiency of semiconductor devices due to deterioration of the bonding state of the laminated substrate 1.

EXAMPLES

An experiment was performed by producing, through the same procedure as in the above embodiment, laminated substrates 1 having various ratios of the linear expansion coefficient of the polycrystalline ceramic substrate 10 to the linear expansion coefficient of the compound semiconductor substrate 30 and checking the bonding state between the polycrystalline ceramic substrate 10 and the compound semiconductor substrate 30 in a temperature range during production of semiconductor devices. This experiment was performed by the following method.

A compound semiconductor substrate 30 formed of gallium arsenide was provided. The linear expansion coefficient $\alpha_2$ of the compound semiconductor substrate 30 formed of gallium arsenide at 30° C. to 300° C. is 6.4 ppm/° C. On the other hand, polycrystalline ceramic substrates 10 having different linear expansion coefficients $\alpha_1$ at 30° C. to 300° C. were produced using one ceramic powder (ceramic A) or a mixture of two ceramic powders (ceramic A and ceramic B) listed in Table 1. Each of the polycrystalline ceramic substrates 10 was bonded to the compound semiconductor substrate 30 formed of gallium arsenide through the same procedure as in the embodiment to obtain a laminated substrate 1. In the mixture of ceramic powders, the mixing ratio of ceramic A to ceramic B was given as "molar ratio: A/B" in Table 1. Silicon dioxide was employed as a material for the bonding layer 20. After a temperature history in a temperature range of 30° C. to 300° C. that corresponds to a temperature range in which an epitaxial layer formed of gallium arsenide is formed was applied to the laminated substrate 1, the area percentage at which the bonding between the polycrystalline ceramic substrate 10 and the compound semiconductor substrate 30 was maintained was investigated. More specifically, the laminated substrate 1 was heated from 30° C. to 300° C. and then cooled to room temperature. Subsequently, the area percentage (bonding area percentage) of a region in which the bonding was maintained on a surface of the compound semiconductor substrate 30 that was expected to be bonded to the polycrystalline ceramic substrate 10 was investigated. Table 1 shows the experimental results.

Furthermore, a compound semiconductor substrate 30 formed of gallium nitride was provided. The linear expansion coefficient $\alpha_4$ of the compound semiconductor substrate 30 formed of gallium nitride at 30° C. to 1000° C. is 6.0 ppm/° C. On the other hand, polycrystalline ceramic substrates 10 having different linear expansion coefficients $\alpha_3$ at 30° C. to 1000° C. were produced using a mixture of two ceramic powders (ceramic A and ceramic B) listed in Table 2. Each of the polycrystalline ceramic substrates 10 was bonded to the compound semiconductor substrate 30 formed of gallium nitride through the same procedure as in the embodiment to obtain a laminated substrate 1. In the mixture of ceramic powders, the mixing ratio of ceramic A to ceramic B was given as "molar ratio: A/B" in Table 2. Silicon dioxide was employed as a material for the bonding layer 20. After a temperature history in a temperature range of 30° C. to 1000° C. that corresponds to a temperature range in which an epitaxial layer formed of gallium nitride is formed was applied to the laminated substrate 1, the area percentage at which the bonding between the polycrystalline ceramic substrate 10 and the compound semiconductor substrate 30 was maintained was investigated. More specifically, the laminated substrate 1 was heated from 30° C. to 1000° C. and then cooled to room temperature. Subsequently, the area percentage (bonding area percentage) of a region in which the bonding was maintained on a surface of the compound semiconductor substrate 30 that was expected to be bonded to the polycrystalline ceramic substrate 10 was investigated. Table 2 shows the experimental results.

range of 4.5 ppm/° C. to 5.8 ppm/° C. In contrast, the bonding area percentage is 70% or less in Comparative Examples A to C in which the relational expression (1) is not satisfied.

$$0.7<\alpha_1/\alpha_2<0.9 \tag{1}$$

Referring to Table 2, the bonding area percentage exceeds 95% in Examples D and E in which the relational expression (2) is satisfied, that is, in which the linear expansion coefficient $\alpha_3$ of the polycrystalline ceramic substrate 10 is in the range of 4.2 ppm/° C. to 5.4 ppm/° C. In contrast, the bonding area percentage is 60% in Comparative Example D in which the relational expression (2) is not satisfied.

$$0.7<\alpha_3/\alpha_4<0.9 \tag{2}$$

It has been confirmed from the above results that the polycrystalline ceramic substrate according to the present application in which the ratio of the linear expansion coefficient of the polycrystalline ceramic substrate to the linear expansion coefficient of the compound semiconductor substrate is set to more than 0.7 and less than 0.9, and the bonding-layer-including polycrystalline ceramic substrate and the laminated substrate that each include the polycrystalline ceramic substrate can suppress the decrease in the production efficiency of semiconductor devices due to deterioration of a bonding state.

The embodiments and Examples disclosed herein are mere examples in all respects and should be understood as being non-limitative in any perspective. The scope of the present invention is defined not by the above description but by claims. The scope of the present invention is intended to embrace all the modifications within the meaning and range of equivalency of the claims.

The invention claimed is:

1. A laminated substrate comprising a polycrystalline ceramic substrate, a compound semiconductor substrate, and a bonding layer interposed between the polycrystalline ceramic substrate and the compound semiconductor substrate, wherein at least one of relational expression (1) and relational expression (2) holds:

$$0.7<\alpha_1/\alpha_2<0.9 \tag{1}$$

$$0.7<\alpha_3/\alpha_4<0.9 \tag{2}$$

where $\alpha_1$ represents a linear expansion coefficient of the polycrystalline ceramic substrate at 30° C. to 300° C. and $\alpha_2$ represents a linear expansion coefficient of the compound semiconductor substrate at 30° C. to 300° C., $\alpha_3$ represents a linear expansion coefficient of the polycrystalline ceramic substrate at 30° C. to 1000° C.

TABLE 1

|  | Comparative Example A | Comparative Example B | Example A | Example B | Example C | Comparative Example C |
|---|---|---|---|---|---|---|
| Ceramic A | spinel | alumina | alumina | alumina | alumina | mullite |
| Ceramic B | — | mullite | mullite | mullite | mullite | — |
| Molar ratio: A/B | — | 30.6 | 7.8 | 3.4 | 2.3 | — |
| Linear expansion coefficient $\alpha_1$ (ppm/° C.) | 7.0 | 6.3 | 5.6 | 5.0 | 4.7 | 4.2 |
| Young's modulus (GPa) | 280 | 370 | 270 | 240 | 240 | 200 |
| $\alpha_1/\alpha_2$ | 1.09 | 0.98 | 0.88 | 0.78 | 0.73 | 0.66 |
| Bonding area percentage | 50% | 60% | >95% | >95% | >95% | 70% |

TABLE 2

|  | Comparative Example D | Example D | Example E |
|---|---|---|---|
| Ceramic A | alumina | alumina | alumina |
| Ceramic B | silica | silica | silica |
| Molar ratio: A/B | 3.3 | 1.8 | 0.6 |
| Linear expansion coefficient $\alpha_3$ (ppm/° C.) | 6.1 | 5.3 | 4.8 |
| Young's modulus (GPa) | 280 | 260 | 250 |
| $\alpha_3/\alpha_4$ | 1.02 | 0.88 | 0.80 |
| Bonding area percentage | 60% | >95% | >95% |

Referring to Table 1, the bonding area percentage exceeds 95% in Examples A to C in which the relational expression (1) is satisfied, that is, in which the linear expansion coefficient $\alpha_1$ of the polycrystalline ceramic substrate 10 is in the and $\alpha_4$ represents a linear expansion coefficient of the compound semiconductor substrate at 30° C. to 1000° C., wherein the polycrystalline ceramic substrate is formed of at least one material selected from the group consisting of spinel, alumina, magnesia, silica, mullite, cordierite, calcia, titania, silicon nitride, and silicon carbide, wherein the compound semiconductor substrate is formed of gallium arsenide and the relational expression (1) holds, the polycrystalline ceramic substrate is a sintered body of a mixture of alumina powder and mullite powder, the molar ratio of alumina to mullite in the mixture is from 2.3 to 7.8, and relational expression (3) holds:

$$0.73 \leq \alpha_1/\alpha_2 \leq 0.88 \qquad (3).$$

2. The laminated substrate according to claim 1, wherein the polycrystalline ceramic substrate has a Young's modulus of 200 GPa or more.

3. The laminated substrate according to claim 1, wherein the bonding layer is formed of an oxide containing silicon.

4. The laminated substrate according to claim 1, wherein the bonding layer is formed on a main surface of the polycrystalline ceramic substrate.

5. The laminated substrate according to claim 1, wherein
the bonding layer is formed on a main surface of the polycrystalline ceramic substrate,
the compound semiconductor substrate is disposed on the bonding layer, and
the polycrystalline ceramic substrate and the compound semiconductor substrate are bonded to each other via the bonding layer.

* * * * *